United States Patent [19]

Bokisa, Sr. et al.

[11] Patent Number: 5,411,595
[45] Date of Patent: May 2, 1995

[54] POST-ETCH, PRINTED CIRCUIT BOARD CLEANING PROCESS

[75] Inventors: George S. Bokisa, Sr., North Olmsted; Gary W. Loar, Parma, both of Ohio; Americus C. Vitale, West Chester, Pa.

[73] Assignee: McGean-Rohco, Inc., Cleveland, Ohio

[21] Appl. No.: 90,892

[22] Filed: Jul. 13, 1993

[51] Int. Cl.$^6$ ............................................... B08B 3/08
[52] U.S. Cl. ........................................ 134/2; 134/38; 134/40
[58] Field of Search ............... 134/40, 2, 38; 252/548, 252/174.14, 105; 204/43; 106/1.22

[56] References Cited

U.S. PATENT DOCUMENTS

| | | | |
|---|---|---|---|
| 4,033,835 | 7/1977 | Lerner et al. | 204/43 |
| 4,053,372 | 10/1977 | Davis | 204/43 |
| 4,440,608 | 4/1984 | Opaskar et al. | 204/43 |
| 4,657,632 | 4/1987 | Holtzman et al. | 156/659.1 |
| 4,885,064 | 12/1989 | Bokisa et al. | 204/44.4 |
| 5,196,053 | 3/1993 | Dodd et al. | 106/1.22 |
| 5,296,041 | 3/1994 | Vinci et al. | 134/40 |
| 5,334,332 | 8/1994 | Lee | 252/548 |
| 5,350,457 | 9/1994 | Kitazawa et al. | 134/10 |

OTHER PUBLICATIONS

Printed Circuits Handbook, Third Edition, edited by Clyde F. Coombs, Jr., McGraw-Hill, Dec. 1988; pp. 11.21–11.24, 14.4–14.5; 23.13 and 23.16–23.17.

*Primary Examiner*—Scott Kastler
*Attorney, Agent, or Firm*—William P. Hauser

[57] ABSTRACT

A novel, environmentally innocuous, post-etch, pre-soldering cleaner and cleaning process is disclosed for removing contaminants from plated surfaces of printed circuit boards manufactured by the pattern plating method. The post-etch, cleaning process of this invention, for removing contaminants from plated surfaces of an etched printed circuit, comprises treating the plated surfaces with a cleaning solution which comprises an aqueous solution of (i) an imidazole-2-thione compound and (ii) an acid. The imidazole-2-thione compound has the formula:

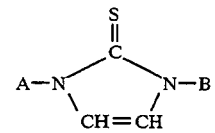

wherein A and B are the same or different —R—Y groups, wherein R is a linear, branched or cyclic alkenyl group containing 1 to 12 carbon atoms and Y is a hydrogen, halogen, cyano, vinyl, phenyl or ether moiety. Of this class of compounds, 1-methyl-3-propylimidazole-2-thione is preferred. The novel aqueous cleaners of this invention are effective replacements for conventional cleaners containing the toxic material thiourea and are superior to cleaners free of thiourea.

14 Claims, No Drawings

POST-ETCH, PRINTED CIRCUIT BOARD CLEANING PROCESS

BACKGROUND OF THE INVENTION

1. Field of the Invention

This invention relates to the fabrication of printed circuit boards. More particularly, this invention relates to the fabrication of printed circuit boards by the pattern plating method in which a pattern plated metal, e.g., solder, is used as an etch resist. Still more particularly, this invention relates to post-etch cleaning processes for the fabrication of printed circuit boards by the pattern plating process.

2. Description of Related Art

The manufacture of printed circuit boards and the soldering of components therewith is generally disclosed in "Printed Circuits Handbook", Third Edition, edited by Clyde F. Coombs, Jr., McGraw-Hill, 1988. In particular, Coombs describes the pattern plating method (also known as the plate-and-etch method) in Chapter 11, pages 11.21–11.24. In the pattern plating method of circuit board manufacture, a polymeric or resin resist image is first formed on a copper clad circuit board substrate and then a metal which is resistant to etchants, e.g., a tin-lead solder alloy, is plated on the copper surface areas not protected by the polymer resist image to form a complimentary metal resist image. The metal resist material may be deposited electrolytically, e.g., by use of the tin or tin alloy plating baths as disclosed in Section 14.2.5, p.p. 14.4 et seq., of "Printed Circuits Handbook", supra; Bokisa et al., U.S. Pat. No. 4,885,064; Opaskar et al., U.S. Pat. No. 4,440,608; Davis U.S. Pat. 4,053,372; and Lerner et al., U.S. Pat. No. 4,033,835. Alternatively, the metal resist material may be deposited by an immersion plating process, e.g., such as the tin immersion plating processes disclosed in Holtzman et al., U.S. Pat. No. 4,657,632, wherein thiourea is used as a complexing agent, and Dodd et al., U.S. Pat. No. 5,196,053, wherein an imidazole-2-thione compound is used as a complexing agent. After pattern plating, the polymer resist image is then stripped from the copper surface and the uncovered copper not protected by the metal, e.g., by the tin-lead resist image, is removed from the substrate by an etchant to form the printed circuit. In subsequent, conventional soldering operations, a solder mask is first applied to the printed circuit board to cover all board areas except where components are to be soldered thereto. Prior to the application of the solder mask the electrolytically deposited tin-lead etch resist on the circuit typically is reflowed at elevated temperatures and since the reflow is not always uniform the circuit board sometimes has to be subjected to a leveling process. Such a leveling process comprises immersing the board in molten solder followed by passing the board over a hot air knife, i.e., a constricted elongated hot air jet, thereby to even the solder thickness and clear board through-holes of residual solder.

Conventional soldering operations are described in Part 5 of "Printed Circuits Handbook", supra. In particular, problems in reflowing plated coatings are identified in Section 23.7.3, p. 23.13, wherein it is recognized that codeposited impurities, especially copper in tin-lead, can cause dewetting in a reflowed deposit and that heavy oxidation or tarnish films that result from chemical attack by etching must be removed prior to reflowing. The causes of poor solderability are further identified in Section 23.11, pp. 23.16–23.17, and the use of precleaners are disclosed to restore solderability. In particular, it is recognized that tarnishing of the tin or tin-lead coating during etching or storage can detract from solderability. Typical acid cleaners disclosed for removing tarnish from tin or tin-lead contain thiourea, fluoboric acid, wetting and complexing agents.

Typical commercial post-etch, precleaners used to restore solderability such as described supra, use thiourea. However, since thiourea is a toxic material and has been identified as a carcinogen, additional measures are needed in handling such precleaners safely and disposing of process wastes while rendering them innocuous to the environment. There is a need for a high efficiency, post-etch cleaning process and precleaners therefor, which is safer to handle and is innocuous to the environment.

SUMMARY OF THE INVENTION

This need is met by the environmentally innocuous, post-etch, cleaning process of this invention which is a process for removing contaminants from plated surfaces of an etched printed circuit comprising treating the plated surfaces with a cleaning solution comprising an aqueous solution of (i) an imidazole-2-thione compound of the formula:

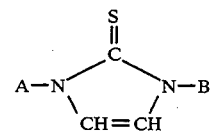

wherein A and B are the same or different —R-Y groups, wherein R is a linear, branched or cyclic alkenyl group containing 1 to 12 carbon atoms and Y is a hydrogen, halogen, cyano, vinyl, phenyl or ether moiety; and (ii) an acid.

An added embodiment of the present invention is a cleaning solution for removing contaminants from plated surfaces of an etched printed circuit, the cleaning solution consisting essentially of an aqueous solution of (i) an imidazole-2-thione compound of the formula:

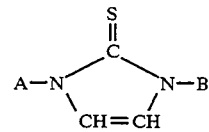

wherein A and B are the same or different —R—Y groups, wherein R is a linear, branched or cyclic alkenyl group containing 1 to 12 carbon atoms and Y is a hydrogen, halogen, cyano, vinyl, phenyl or ether moiety; and (ii) an acid.

In a further embodiment of the present invention, the imidazole-2-thione compound is an unsymmetrical 1,3-dialkylimidazole-2-thione wherein A is methyl or ethyl, and when A is methyl, B is a $C_3$ to $C_6$ alkyl or cycloalkyl group, and when A is ethyl, B is a $C_4$ to $C_6$ alkyl or cycloalkyl group.

DETAILED DESCRIPTION OF THE INVENTION

The present invention is directed to a novel environmentally innocuous, post-etch, pre-soldering cleaner and cleaning process for removing contaminants from plated surfaces of printed circuit boards manufactured by the pattern plating method. The novel aqueous cleaners used in the process of this invention are effective replacements for conventional cleaners containing the toxic material thiourea and are superior to cleaners free of thiourea. Moreover, it has been unexpectedly discovered that the imidazole-2-thione compounds of this invention when used on an equimolar basis, are superior to thiourea.

The post-etch, cleaning process of this invention, for removing contaminants from plated surfaces of an etched printed circuit, comprises treating the plated surfaces with a cleaning solution which comprises an aqueous solution of (i) an imidazole-2-thione compound and (ii) an acid. The imidazole-2-thione compound has the formula:

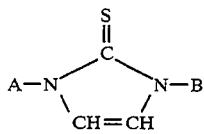

wherein A and B are independently hydrocarbyl or substituted hydrocarbyl. More particularly A and B are the same or different —R—Y groups, wherein R is a linear, branched or cyclic alkenyl group containing 1 to 12 carbon atoms and Y is a hydrogen, halogen, cyano, vinyl, phenyl or ether moiety. Preferably the compound is a 1,3-dialkylimidazole-2-thione compound Wherein A and B each individually is an alkyl or cycloalkyl group containing one to six carbon atoms. The imidazole-2-thione compound may be symmetrical, i.e., A and B are the same group, or unsymmetrical. Preferred are unsymmetrical 1,3-dialkylimidazole-2-thione compounds wherein A is methyl or ethyl, and when A is methyl, B is a $C_3$ to $C_6$ alkyl or cycloalkyl group, and when A is ethyl, B is a $C_4$ to $C_6$ alkyl or cycloalkyl group. Preferred of this class of compounds is 1-methyl-3-propylimidazole-2-thione having the formula:

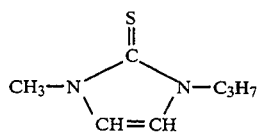

Alternatively, useful symmetrical 1,3-dialkylimidazole-2-thione compounds have the formula:

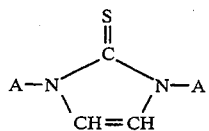

wherein each A is the same alkyl or cycloalkyl group containing one to six carbon atoms. Preferred of this class of compounds is 1,3-dimethylimidazole-2-thione.

The acids that are used may be organic acids or inorganic acids (mineral acids) based on sulfur, phosphorus, boron, the halogens, or the mixtures thereof, the halogen based mineral acids being preferred, such as hydrochloric acid and fluoboric acid. The sulfur based mineral acids, such as sulfuric acid and sulfamic acid may also be used. Preferred of this class is the mixture of sulfuric acid and hypophosphorus acid. Some of the organic acids that may be used comprise monocarboxylic or dicarboxylic acids having one to six carbon atoms such as formic acid, acetic acid, malic acid, maleic acid, and the like. Alternatively, the organic acids that may be used comprise alkyl or aryl sulfonic acids such as methane sulfonic acid, p-toluene sulfonic acid, and the like. Typically, the aqueous cleaning solution may have a pH of about 4 or less, e.g., in the instance when HCl is used the pH is 1 or less. Alternatively, when a cosolvent is used, the pH may be greater than 4.

When the solubility of the imidazole-2-thione compound in the aqueous cleaning solution is low, a cosolvent may be added to solubilize the compound and thereby enhance the cleaning activity of the resulting solution. Suitable cosolvents are water miscible solvents such as alcohols, e.g., ethanol; glycols, e.g., ethylene glycol; alkoxyalkanols, e.g., 2-butoxyethanol; ketones, e.g., acetone; aprotic solvents such as dimethylformamide, dimethyl sulfoxide, acetonitrile, and the like; and mixtures thereof.

The aqueous cleaning solutions may also contain additives, such as chelating agents, surfactants, and the like, or mixtures thereof.

Chelating agents may be used in minor amounts with the imidazole-2-thione of this invention to aid in the solubility of the metal ion and prevention of precipitation. Cheleating agent that may be used generally comprise the various classes of chelating agents and specific compounds disclosed in Kirk-Othmer, *Encyclopedia of Chemical Technology*, Third Edition, Volume 5, pages 339-368. Chelating agents that are especially preferred comprise aminocarboxylic acids and hydroxycarboxylic acids. Some aminocarboxylic acids that may be used comprise ethylenediaminetetraacetic acid, hydroxyethyl-ethylenediaminetriacetic acid, nitrilotriacetic acid, N-dihydroxyethylglycine, and ethylenebis(hydroxyphenylglycine). Hydroxy carboxylic acids that may be used comprise tartaric acid, citric acid, gluconic acid and 5-sulfosalicylic acid.

Surfactants, or wetting agents, may be used conventionally to enhance the wetting of the plated circuit surface with the aqueous cleaning solution of this invention and to disperse any particulates resulting from the cleaning process. The surfactants that may be used comprise any nonionic, anionic, cationic or amphoteric surfactant such as those listed in Kirk-Othmer, *Encyclopedia of Chemical Technology*, Third Edition, Volume 22, pages 332-387. The nonionic surfactants are especially preferred.

The various components of the aqueous cleaning solution may be present at conventionally established concentrations. Typically, the cleaning solution will contain on a molar basis:

about 0.01 to about 1 part and preferably about 0.03 to about 0.4 part of a the imidazole-2-thione compound; and about 0.5 to about 6.0 parts of an acid.

The solution may also contain up to about 10 % by weight of a surfactant. The solution concentrations may, of course, vary depending on the particular cleaning application intended. In the instance when a cosolvent is used, the solution may be acid free.

In the pattern plating method of circuit board manufacture, a polymeric or resin resist image is first formed on a copper clad circuit board substrate and then a metal which is resistant to etchants is plated on the copper surface areas not protected by the polymer resist image to form a complimentary metal resist image. When the resulting printed circuit is to be soldered, the metal used to form the resist typically is tin or a tin-lead solder alloy to facilitate solderability. The metal resist material may be deposited electrolytically or by an immersion plating process using the plating baths described supra. After pattern plating, the polymer resist image is then stripped from the copper surface and the uncovered copper not protected by the metal, e.g., by the tin-lead resist image, is removed from the substrate by an etchant to form the printed circuit. Illustrative of the conventional use of solder plate and tin plating as metal resists, is the multistep process disclosed on page 14.5 of "Printed Circuits Handbook", Third Edition, edited by Clyde F. Coombs, Jr., McGraw-Hill, 1988 which is incorporated herein by reference. In the final steps of the pattern plating process, the etched boards are water rinsed, neutralized, rinsed again and then blown dry to rinse away etchant residues and to maintain optimum surface properties. In the post-etch, cleaning process of this invention, the etched board may be treated with the novel aqueous cleaning solution at any stage after etching. Preferably, the plated surfaces of the etched printed circuit are treated with the cleaning solution immediately after etching and rinsing is completed and while the plated surfaces are still wet. In particular, the board may be treated immediately after the first rinsing step in place of the conventional neutralization step. Stored dry boards also may be treated at any stage prior to the actual soldering of components to the printed circuit board. The plated surfaces of the printed circuit may be treated by applying the aqueous cleaner using any conventional application means. Thus the plated surfaces of the etched printed circuit may be treated with the cleaning solution by an immersion, spraying, pouring or cascading procedure. Alternatively, the cleaning solution may be applied with an applicator means, e.g., such as a brush, sponge, and the like. The cleaning solution may be applied at ambient temperatures, e.g., room temperature, or above. Typically, the application temperature is between about 15° C. and about 32° C. The duration of treatment, i.e., the period of time during which the cleaning solution remains in intimate contact with the plated surfaces of the printed circuit, typically will last about 5 seconds or longer, and preferably, between about 60 seconds and about 120 seconds. After treatment, excess cleaning solution typically is removed with a final water rinse and the cleaned circuit board is dried conventionally, e.g., blow drying, baking in an oven, and the like.

In addition to its use in the manufacture of printed circuit boards described supra, the cleaning process of this invention may be used in other applications, e.g., as cleaners for copper, pewter or silver utensils and the like.

The post-etch cleaning process and aqueous cleaning solutions of this invention will now be illustrated by the following examples but is not intended to be limited thereby. In each of the following examples, Compound 1 is the unsymmetrical dialkyl imidazole-2-thione of this invention 1-methyl-3-n-propylimidazole-2-thione, which has the structure as given supra and Compound 2 is the symmetrical compound 1,3-dimethylimidazole-2-thione.

EXAMPLE 1

The cleaning effectiveness on a Sn/Pb deposit of an acetic acid solution was compared to that of an acetic acid solution containing Compound 1 (1-methyl-3-n-propylimidazole-2-thione). Two test cleaner solutions were prepared. Solution 1 consisted of 10 % by weight of acetic acid in water and Solution 2 consisted of 10 % by weight of acetic acid in water and 50.0 g/l (~0.32 moles/l) of Compound 1. (Compound 1 alone was not sufficiently soluble in water to form a comparable test cleaner solution.)

A Sn/Pb deposit was conventionally electroplated onto standard Hull Cell panels at 2 amps for 5 minutes with standard paddle agitation. To simulate the effects of spray etching, spent ammoniacal cupric chloride etchant was sprayed on the Sn/Pb deposit. (Spraying is believed necessary to simulate copper oxidation from aerial oxygen in the etching mechanism.) The panels were sprayed for about two minutes to simulate a commercial etcher. The spraying of the etchant onto the panels turned the surface of the deposit to a dark, streaky grey color. These test panels were then rinsed with water and then subjected to a 30 second immersion in either Solution 1 or Solution 2. Immersion in Solution 1, containing only acetic acid, caused the deposit to lighten in color as expected. Immersion in Solution 2, containing both acetic acid and Compound 1, caused an immediate blue swirl in the solution with the resulting treated, test panel being lighter in color than the test panel treated with the solution of acetic acid alone. The test panel treated by Solution 2, however, was not as light as a plated panel which had not been subjected to etchant.

EXAMPLE 2

The cleaning effectiveness on etchant treated Sn/Pb deposit of four post-etch cleaning solutions were compared.

Cleaning solution formulations were as follows:
Solution A—Water solution containing:
  25 g/l (0.16 moles/l) of Compound 1
  15% by volume acetic acid.
Solution B—Water solution containing:
  25g/l (0.16 moles/l) of Compound 1
  15% by volume hydrochloric acid.
Solution C—Water solution containing:
  25g/l (0.33 moles/l) of thiourea
  15% by volume hydrochloric acid.
Solution D—A commercial solder brightener which is an
  aqueous hydrochloric acid solution having a pH of 0 or less (i.e., about 20% by weight of the acid) and has as its major constituents 1H-benzotriazole, tolyltriazole and sodium xylene sulfonate.

Cleaning effectiveness was gauged by comparison of Sn/Pb electroplated Hull cell panels that had been oxidized and discolored by an ammoniacal cupric chloride etchant to a panel which had not been treated with the etchant. Hull cell panels were electroplated for 5 minutes at 2 amperes using a commercial tin/lead plating process that produces a nominal 60/40 Sn/Pb alloy with a matte finish ("Tin Lead 505 Process" as disclosed by McGean-Rohco, Inc., Cleveland, Ohio, in their Data Sheet PD-3036-5-83 (Revised 11-86), a copy of which is appended hereto as Appendix A). The ammoniacal etchant contained about 25 ounces/gallon (~187 g/l) copper chloride, at 4.8M, pH of about 8.3 and a temperature of 125° C. The etchant was sprayed onto the panels for 5 minutes in an alternating 15 second on/off cycle. An etchant treated panel was then dipped into one of the four cleaning solutions at room temperature, i.e., about 21° C., for either 30 or 60 seconds, rinsed with water, dried and evaluated.

Prior to application of the etchant, the plated panels have a uniform light gray color from end to end. After application of the etchant, the panels are non-uniform, streaked, dark gray. The effectiveness of each cleaning solution is gauged on its ability to eliminate the discoloration and restore the panel to a condition nearly like the "as plated" panel. Solution C, containing 0.33 moles/l thiourea and HCl produced a panel nearly identical in appearance to an "as plated" panel. Solution B, containing just 0.16 moles/l Compound 1 and HCl was nearly as effective in removing discoloration as Solution C containing thiourea at twice the molar concentration. Solution A, containing 0.16 moles/l Compound 1 and acetic acid produced a panel which was somewhat lightened in coloration but was not considered as effective as either Solution B or Solution C. Solution D which was the commercial solder brightening formulation, produced a panel with some slight lightening of the oxidized surface with a more uniform dark gray appearance and was judged to be the least effective of the cleaning solutions tested. While solubility considerations may be a factor in using higher concentrations of Compound 1 in water acid solutions, it was concluded that even at the lower molar concentration used, Compound 1, i.e., 1-methyl-3-n-propylimidazole-2-thione, functioned as well as thiourea in HCl formulations to eliminate discoloration and restore plated surfaces to a condition nearly like the "as plated" surface.

Those skilled in the art having the benefit of the teachings of the present invention as hereinabove set forth, can effect numerous modifications thereto. These modifications are to be construed as being encompassed within the scope of the present invention as set forth in the appended claims.

What is claimed is:

1. A process for removing contaminants from plated surfaces of an etched printed circuit comprising removing said contaminants by treating the plated surfaces with a cleaning solution consisting essentially of removing said contaminants by aqueous solution of (i) an imidazole-2-thione compound of the formula:

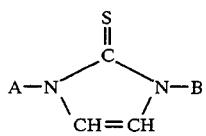

wherein A and B are the same or different —R—Y groups, wherein R is a linear, branched or cyclic alkenyl group containing 1 to 12 carbon atoms and Y is a hydrogen, halogen, cyano, vinyl, phenyl or ether moiety; and (ii) an acid.

2. The process of claim 1 wherein the imidazole-2-thione compound is an unsymmetrical 1,3-dialkylimidazole-2-thione wherein A is methyl or ethyl, and when A is methyl, B is a $C_3$ to $C_6$ alkyl or cycloalkyl group, and when A is ethyl, B is a $C_4$ to $C_6$ alkyl or cycloalkyl group.

3. The process of claim 2 wherein the unsymmetrical 1,3-dialkylimidazole-2-thione is 1-methyl-3-propylimidazole-2-thione having the formula:

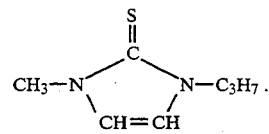

4. The process of claim 1 wherein the acid (ii) is an inorganic acid based on sulfur, phosphorus, boron, the halogens or mixtures thereof.

5. The process of claim 4 wherein the acid (ii) is hydrochloric acid, sulfuric acid, fluoboric acid or sulfamic acid.

6. The process of claim 1 wherein the acid (ii) is an organic monocarboxylic or dicarboxylic acid having one to six carbon atoms.

7. The process of claim 6 wherein the organic acid is taken from the group consisting of formic acid, acetic acid, malic acid, maleic acid, and mixtures thereof.

8. The process of claim 1 wherein the aqueous solution contains a cosolvent.

9. The process of claim 8 wherein the cosolvent is a solvent taken from the group consisting of alcohols, glycols, alkoxyalkanols, ketones, and aprotic polar solvents.

10. The process of claim 1 wherein the aqueous solution contains an additive selected from the group consisting of a chelating agent, a surfactant, and mixtures thereof.

11. The process of claim 1 wherein the cleaning solution has a pH of about 4 or less.

12. The process of claim 1 wherein the plated surfaces of the etched printed circuit are treated with the cleaning solution at a temperature between about 15° C. and about 32° C.

13. The process of claim 1 wherein the plated surfaces of the etched printed circuit are treated with the cleaning solution immediately after etching and rinsing is completed and while the plated surfaces are still wet.

14. The process of claim 1 wherein the plated surfaces of the etched printed circuit are treated with the cleaning solution by an immersion, spraying, pouring or cascading.

* * * * *